(12) United States Patent
Inagawa et al.

(10) Patent No.: US 6,215,076 B1
(45) Date of Patent: Apr. 10, 2001

(54) PRINTED CIRCUIT BOARD WITH NOISE SUPPRESSION

(75) Inventors: Hideho Inagawa, Yokohama; Toru Otaki, Tokyo, both of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 08/824,798

(22) Filed: Mar. 26, 1997

(30) Foreign Application Priority Data

Mar. 28, 1996 (JP) .................................................... 8-074352
May 16, 1996 (JP) .................................................... 8-121541

(51) Int. Cl.[7] ................................. H01R 9/09; H05K 1/00
(52) U.S. Cl. ......................... 174/261; 174/250; 174/262; 361/777; 361/766
(58) Field of Search ..................................... 174/250, 255, 174/257, 260, 261, 262; 361/764, 766, 777, 782

(56) References Cited

U.S. PATENT DOCUMENTS

| | | | |
|---|---|---|---|
| 4,362,899 | * 12/1982 | Borrill ...................................... | 174/36 |
| 4,831,497 | * 5/1989 | Webster et al. ....................... | 361/406 |
| 5,063,280 | 11/1991 | Inagawa et al. ..................... | 219/121.7 |
| 5,073,687 | 12/1991 | Inagawa et al. ..................... | 219/121.7 |
| 5,215,593 | 6/1993 | Nojo et al. ............................ | 134/22.1 |
| 5,302,798 | 4/1994 | Inagawa et al. ..................... | 219/121.7 |
| 5,541,369 | * 7/1996 | Tahara et al. ......................... | 174/268 |
| 5,723,908 | * 3/1998 | Fuchida et al. ....................... | 257/758 |
| 5,764,489 | * 6/1998 | Leigh et al. ........................... | 361/777 |

FOREIGN PATENT DOCUMENTS 1-47032   10/1989 (JP) .

OTHER PUBLICATIONS

Coombs, Jr., Clyde, Printed Circuits Handbook, 4th ed., Published by McGraw–Hill, pp. 11.1 to 11.4, 1995.*

* cited by examiner

*Primary Examiner*—Hyung-Sub Sough
*Assistant Examiner*—Kamand Cuneo
(74) *Attorney, Agent, or Firm*—Fitzpatrick, Cella, Harper & Scinto

(57) ABSTRACT

Noise frequency generated from a circuit is determined. The distance between two arbitrary lines of a plurality of power feed lines or a plurality of power return lines extending parallel to each other is determined on the basis of the determined noise frequency in question. The distance between jumper lines for bridging the two arbitrary lines is determined on the basis of the noise frequency, thereby suppressing emitted noise which can be generated on a printed circuit board.

26 Claims, 11 Drawing Sheets

PRINTED CIRCUIT BOARD WITH NOISE SUPPRESSION

BACKGROUND OF THE INVENTION

1. Field of the Invention

The present invention relates to a method of designing a printed circuit board which can suppress emitted noise that may be generated thereby, and a printed circuit board which suppresses the generation of such emitted noise.

2. Related Background Art

When power-supply patterns and ground potential (to be referred to as ground hereinafter) patterns are to be formed on a printed circuit board, a multilayer printed circuit board is often used. In general, in the multilayer printed circuit board, power-supply and ground patterns are formed as inner layers, while electronic parts and the like are mounted as surface layers to form signal patterns.

Power-supply and ground patterns are generally formed in empty spaces on a double- or single-sided printed circuit board in which no signal patterns are formed.

When patterns are to be wired across other patterns, through holes are formed in the respective patterns, and jumper lines are inserted into the through holes and soldered thereto, thereby electrically connecting the respective patterns.

Power-supply and ground patterns to be formed on a conventional printed circuit board are designed without any special consideration as to the relationship between the frequency of the signal as an emitted noise source and the length of each pattern.

Since the power-supply and ground patterns vary in length and area, the inductances of the patterns vary. In some case, therefore, the inductance of a given portion is considerably larger than that of another portion. When a current flows in this large-inductance portion, the potential varies. As a result, high-level emitted noise may be generated.

In addition, when signals are exchanged between active elements such as an IC and an oscillator mounted on a printed circuit board, and a current flows in a pattern connecting these elements, a magnetic field is generated around the pattern. If the pattern in which the current is flowing has inductance, a potential difference is produced between the pattern and another pattern to generate an electric field. The generated magnetic and electric fields are spread/radiated outword, and the emitted noise caused by these magnetic and electric fields adversely affects other signal patterns, resulting in phenomena such as reflection, crosstalk, and delays.

According to conventional printed circuit boards, in order to prevent adverse effects of such emitted noise, resistors are inserted in patterns, and inductors and capacitors are inserted in patterns to cut high-frequency components.

This method of preventing noise by attaching the above parts afterward will prolong the development period and cause an increase in cost because of changes in design.

Under the circumstances, a method of effectively mounting capacitors for noise prevention by making improvements in the layout of patterns formed on a printed circuit board is disclosed in, e.g., Japanese Patent Publication No. 1-47032.

FIG. 17 shows the layout of patterns formed on a conventional printed circuit board. FIG. 18 is an enlarged view showing the main part of the pattern layout in FIG. 17.

As shown in FIG. 17, a plurality of parallel ground lines 121 are formed on the lower surface of the printed circuit board, and a plurality of power-supply lines 122 are formed parallel to the ground lines 121. A plurality of parallel ground lines 131 are formed on the upper surface of the printed circuit board to extend in a direction perpendicular to the ground lines 121 and the power-supply lines 122 formed on the lower surface of the printed circuit board. In addition, a plurality of parallel power-supply lines 132 are formed parallel to the ground lines 131.

This printed circuit board has a plurality of through holes 150 to allow ICs to be mounted on the board.

Referring to FIG. 18, conduction through holes 134 are formed in the intersections of the ground lines 121 on the lower surface and the ground lines 131 on the upper surface. The ground lines 121 on the lower surface are connected to the ground lines 131 on the upper surface through these conduction through holes 134.

Similarly, conduction through holes 136 are formed in the intersections of the power-supply lines 122 on the lower surface and the power-supply lines 132 on the upper surface. The power-supply lines 122 on the lower surface are connected to the power-supply lines 132 on the upper surface through these conduction through holes 136.

Capacitors (not shown) are inserted in the power-supply and ground lines at predetermined positions. These lines are connected to each other in an AC manner through the capacitors, thereby preventing high-frequency noise.

When, for example, a 16-pin DIP (Dual In-line Package) type IC is to be mounted on such a printed circuit board, the power-supply pin (16th pin) of the IC is inserted in a power-supply through hole 110 in FIG. 18, and the ground pin (8th pin) of the IC is inserted in a ground through hole 111 in FIG. 18, thereby supplying power to the IC.

When, however, the performance of a conventional printed circuit board like the one described above was tested, the emitted noise was not reduced in spite of the use of noise prevention capacitors.

This is because, a noise prevention capacitor is not inserted between the power-supply pin and ground pin of the same IC but is inserted between the power-supply pin and ground pin of different ICs.

That is, in the conventional printed circuit board, power-supply and ground lines are formed at optimal intervals for connection with the power-supply pin and ground pin of an IC (in a DIP type general logic IC, these pins are located on two ends in the longitudinal direction), and capacitors are arranged.

In recent years, however, the operating frequencies of ICs is becoming higher. For this reason, if power-supply and ground lines are arranged at intervals near the length of an IC in the longitudinal direction, high-level electromagnetic waves are radiated from the signal lines or the power-supply lines. The high-level electromagnetic waves may adversely affect the self-circuit or other circuits to make them malfunction.

SUMMARY OF THE INVENTION

The present invention has been made to solve the above problems, and has as its object to provide a method of designing a printed circuit board which can suppress the generation of emitted noise, or a printed circuit board.

It is another object of the present invention to provide a single-sided printed circuit board suited for countermeasures against emitted noise.

The above and other objects, features, and advantages of the present invention will be apparent form the following detailed description in conjunction with the accompanying drawings and the appended claims.

BRIEF DESCRIPTION OF THE DRAWINGS

FIGS. 11A, 11B, 11C and 11D show the layouts obtained when the interval of the power-supply and ground lines on the printed circuit board shown in FIG. 7 is changed, in which FIG. 11A is a plan view showing the layout obtained when the interval is about 0 mm, FIG. 11B is a plan view showing the layout obtained when the interval is about 3 mm, FIG. 11C is a plan view showing the layout obtained when the interval is 9 mm, and FIG. 11D is a plan view showing the layout obtained when the interval is 15 mm;

DESCRIPTION OF THE PREFERRED EMBODIMENTS

A method of designing a printed circuit board according to an embodiment of the present invention will be described first with reference to the accompanying drawings. A printed circuit board designed by this design method will be described next.

Principles of Design

As will be described below, pluralities of parallel power-supply lines and parallel ground lines are formed on a printed circuit board of the present invention, and a plurality of parallel jumper lines for bridging these lines are also formed on the board. As a result, the power-supply patterns constituted by the lines and the jumper lines on the printed circuit board have a matrix or three-dimensional checkerboard structure.

In this case, the interval of the respective lines constituting the matrix or checkerboard structure is important. The following printed circuit board design method exemplifies design techniques of determining the matrix or checkerboard intervals from two different viewpoints. One of the design techniques is selected on the basis of the characteristics a circuit to be formed on a printed circuit board to which the present invention is applied. Note that "the characteristics of a circuit" indicate (a) the rise and fall characteristics ($t_r$ and $t_f$) of a signal in a circuit element, and (b) the highest frequency of the frequencies of signals used in the circuit.

The printed circuit board design method will be described below with reference to these two "characteristics of a circuit".

Design Based on $t_r$ and $t_f$

The factors that greatly influence the performance of a system having a digital circuit include the operating frequency of the system and a rise time $t_r$ and a fall time $t_f$ (to be simply referred to as times $t_r$ and $t_f$ hereinafter) of a signal in a circuit element.

The emitted electromagnetic wave level corresponding to the operating frequency will be described first with reference to FIGS. 1 and 2.

Figure 1:
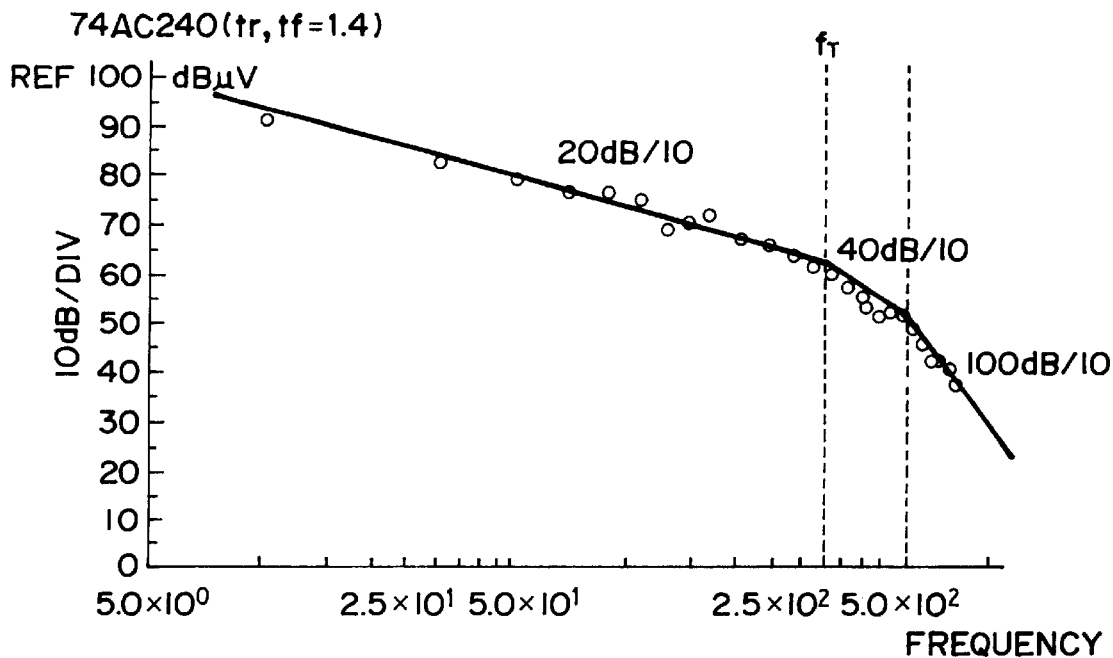
FIG. 1 is a graph showing the emitted noise level of an IC device according to an embodiment of the present invention.

FIG. 1 is a graph showing the emitted electromagnetic wave level characteristic with respect to the operating frequency of 74AC240, which is a digital IC. FIG. 2 a graph showing the emitted electromagnetic wave level characteristic with respect to the operating frequency of 74HC240, which is a digital IC.

The times $t_r$ and $t_f$ of 74AC240 are about 1.4 nsec, whereas those of 74HC240 are about 2.0 nsec. As shown in FIGS. 1 and 2, when the digital ICs operate, electromagnetic waves are emitted at high levels to higher frequencies as the times $t_r$ and $t_f$ are smaller. That is, as the times $t_r$ and $t_f$ are smaller, high-level electromagnetic waves are emitted in a wider band.

In general, an electromagnetic waves include traveling and standing waves. The standing wave exerts a greater influence as emitted noise.

For a standing wave, $f=c/\lambda$ (where c is the velocity of light) holds the frequency (f) and wavelength ($\lambda$). Many electromagnetic waves are generated from a circuit pattern with the wavelength $\lambda$ or $(\frac{1}{2})\lambda$. That is, a circuit pattern having such a length serves as an antenna for emitting a standing wave having the wavelength $\lambda$.

It was found by experiment that if the length of the circuit pattern is $(\frac{1}{2})\lambda$ or less, the potential difference induced on the pattern by an emitted electromagnetic wave becomes smaller than ½ the amplitude of the signal flowing in the circuit pattern.

That is, in a circuit system which does not malfunction as long as the potential difference caused by the influence of an emitted electromagnetic wave is ½ or less the amplitude of the signal, it suffices if the circuit pattern is designed such that the line length of the pattern is (½)λ or less.

Figure 3:
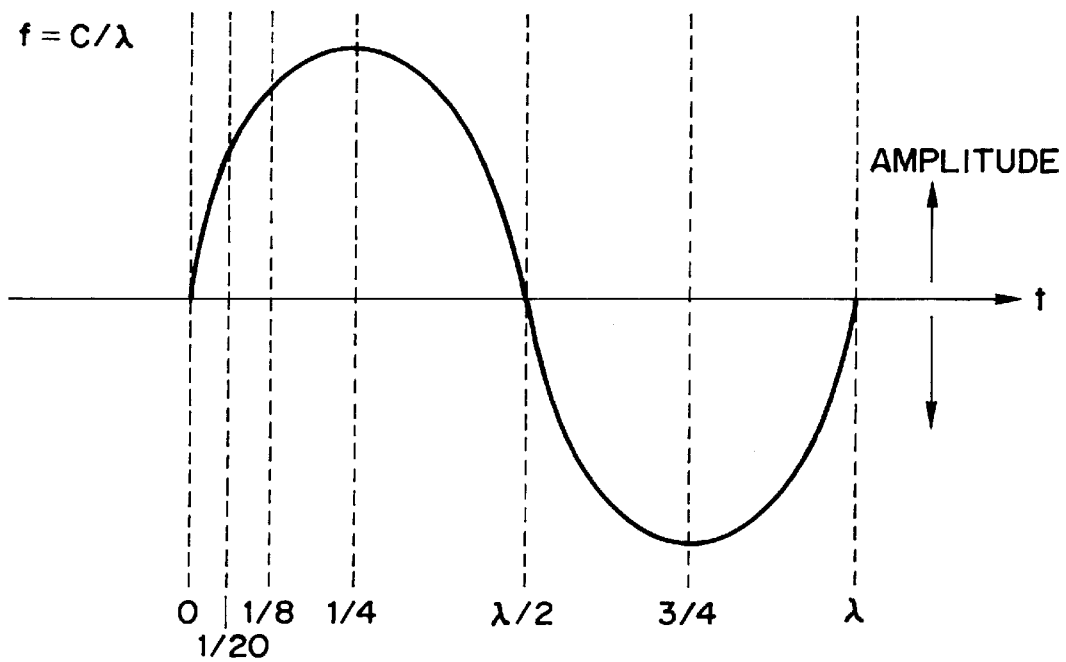
FIG. 3 is a chart associated with the principle of a design method according to the embodiment of the present invention and showing the relationship between the length of a line of a circuit and the amplitude of noise generated therein.

FIG. 3 is a chart showing the amplitude of noise generated with respect to the line length.

Whether a standing wave having a specific frequency poses a problem in a system depends on the times $t_r$ and $t_f$ of a circuit element used in the system.

Figure 2:
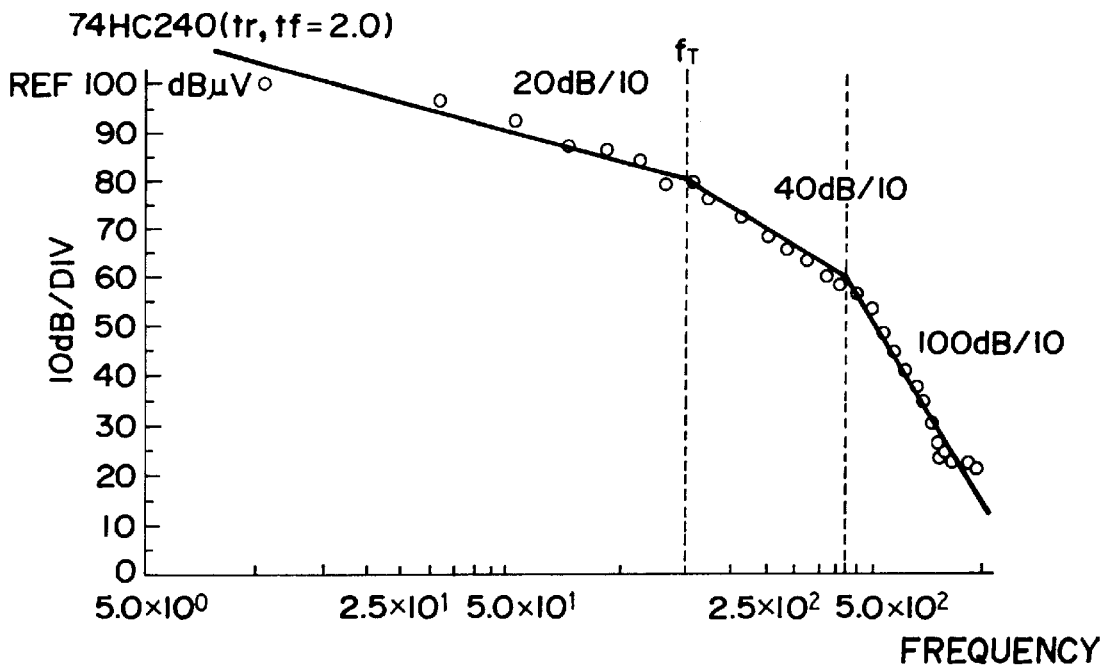
FIG. 2 is a graph showing the emitted noise level of an IC device, which is different from that shown in FIG. 1, according to the embodiment of the present invention.

Referring to FIGS. 1 and 2, if the frequency at the inflexion point at which the reduction rate of noise level changes from 20 dB/oct to 40 dB/oct is defined as a frequency $f_T$ at which noise poses a problem, the frequency $f_T$ is given by:

$$f_T = 1/(\pi t_r) \quad (1)$$

In practice, a signal output from an IC contains components having high frequencies about two or three times the frequency $f_T$. For this reason, it is assumed that a signal containing components having frequencies about three times the frequency $f_T$ at maximum is emitted from a noise emission source, and hence the frequency $f_T$ is defined as follows:

$$f_T = 3/(\pi t_r) \quad (2)$$

In recent years, the times $t_r$ and $t_f$ of ICs have become about 1 nsec or less. The frequency $f_T$ in these ICs is therefore given by:

$$f_T = 3/(\pi \times 1 \times 10^{-9}) \cong 1 \text{ (GHz)} \quad (3)$$

A dielectric constant $\epsilon_r$ of a printed circuit board made of glass epoxy or the like is 3.0 if it has the single-or double-sided structure, and 4.8 if it has a multilayer structure constituted by three or more layers.

Considering the wavelength decreasing effect on this printed circuit board, the wavelength λ of a 1-GHz signal which is calculated according to equation (3) is about 150 mm.

As described above, if the line length of the circuit pattern is set to (½)λ or less the wavelength of an electromagnetic wave emitted from the line, the emitted electromagnetic wave level greatly lowers. For this reason, in a system using an IC whose times $t_r$ and $t_f$ are about 1 nsec or less, it suffices if the line length of the pattern on the board is set to 7.5 mm (=150 mm/20) or less. Mathematically expressed, a length l of the signal line is given by:

$$l \leq \alpha \cdot (c/f_T) \cdot (\frac{1}{2}) \quad (4)$$

where α is the wavelength decreasing rate and c is the velocity of light. In this case, a substitution of equation (4) into expression (2) yields:

$$l \leq \alpha \cdot \{(\pi \cdot c \cdot t_{r(f)})/(3 \cdot 20)\} \quad (5)$$

An excessive decrease in the length of the signal line may lead to an increase in cost because of limitations on wiring. It, therefore, suffices if the lengths of as many signal lines as possible are set to the lengths calculated according to expression (4) or (5).

In designing a printed circuit board, priority is generally given to the layout of circuit elements such as an IC, and hence it is often difficult to design the board with the desired lengths of signal lines.

Power-supply and ground lines are arranged at predetermined intervals, and a signal line is formed between two power-supply lines, two ground lines, or power-supply and ground lines.

In addition to the power-supply lines and the ground lines formed on the printed circuit board, power-supply and ground lines constituted by jumper lines are formed to be perpendicular to the power-supply and the ground lines formed on the board.

Jumper line mounting portions are formed and soldered on the intersections of the power-supply lines on the printed circuit board and the power-supply lines constituted by the jumper lines to electrically connect them. Similarly, jumper line mounting hole portions are formed in the intersections of the ground lines on the printed circuit board and the ground lines constituted by the jumper lines to electrically connect them.

With this process, the length of each signal line and the interval of the power-supply and ground lines can be set to predetermined values.

The reason why the length of each signal line is set to the predetermined value will be described next with reference to FIGS. 4 and 5.

Figure 4:
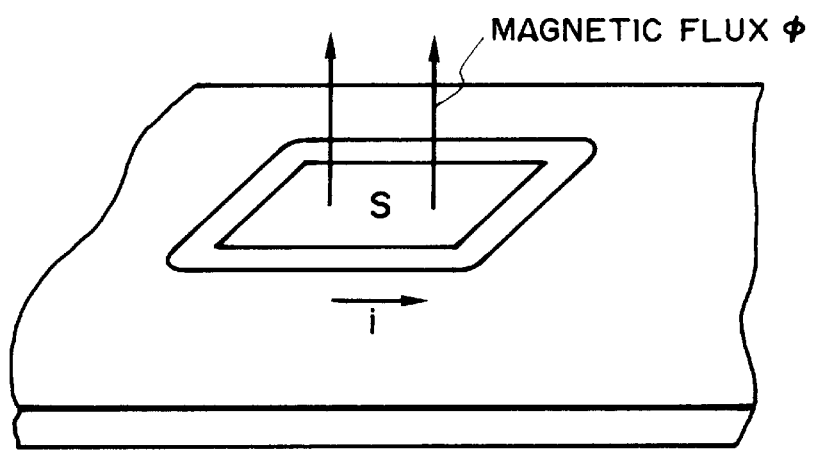
FIG. 4 is a view associated with the principle of the design method according to the embodiment of the present invention and showing how a current flows in a loop-like signal line.

FIG. 4 shows how a current flows in a loop-like signal line formed on a board. FIG. 5 shows how a current flows in a loop obtained by connecting two signal lines via through holes.

Figure 5:
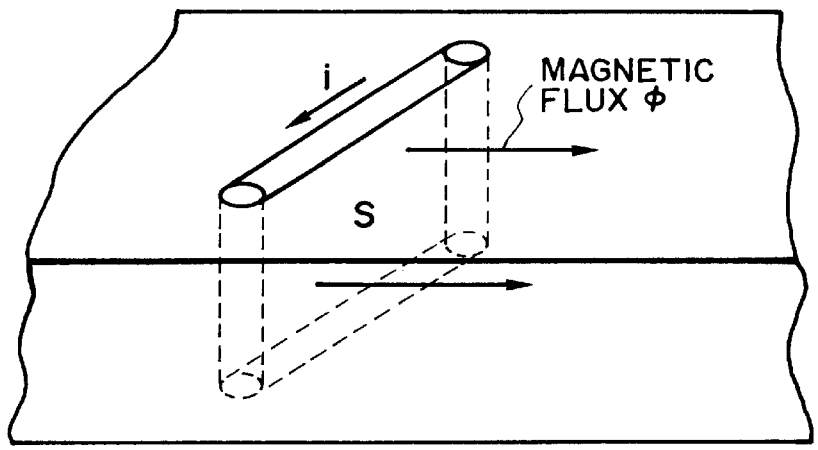
FIG. 5 is a view associated with the principle of the design method according to the embodiment of the present invention and showing how a current flows in a loop formed by two signal lines.

Referring to FIGS. 4 and 5, letting S be the cross-sectional area of the loop made of a conductor or conductors, a magnetic flux φ generated by a current i flowing in the loop is given by:

$$\Phi = k \cdot i \cdot S \quad (6)$$

where k is a constant.

Since the intensity of an electromagnetic wave emitted from the loop is proportional to the magnitude of the magnetic flux Φ, the intensity of the emitted electromagnetic wave can be decreased by decreasing the value of the magnetic flux Φ.

In the present invention, in designing a board, the interval of power-supply and ground lines, the interval of power-supply lines, and the interval of ground lines are set to the values calculated according to expression (4) so as to minimize the cross-sectional area S of the loop.

Figure 6:
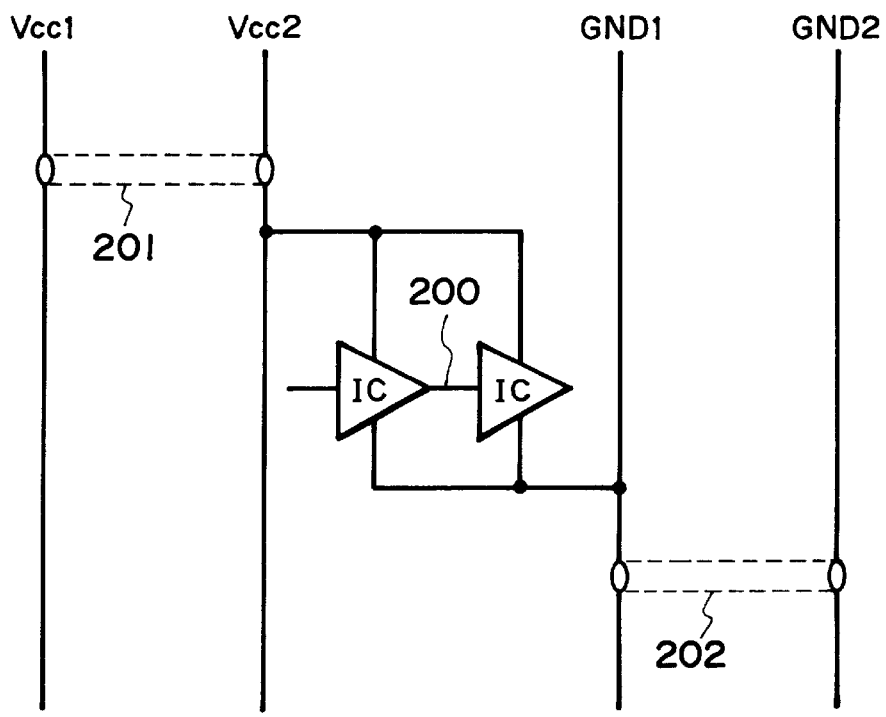
FIG. 6 is a circuit diagram associated with the principle of the design method according to the embodiment of the present invention and showing how an IC is connected between power-supply and ground lines.

FIG. 6 is a circuit diagram showing how ICs are connected between power-supply and ground lines.

Referring to FIG. 6, a current is supplied from a power-supply line Vcc2 to the two ICs, and flows to a ground line $G_{ND}1$. At this time, part of the current flows to the ground line $G_{ND}1$ through a signal line 200.

A power-supply line Vcc1 of the same potential as that of the power-supply line Vcc2 is often formed to be adjacent thereto. Since each power-supply line is designed to have a low impedance, there is no potential difference between the power-supply lines Vcc2 and Vcc1 in general. In a printed circuit board with high-density wiring, since power-supply lines are formed by using thin patterns because of limitations on the pattern layout, each power-supply line has a large impedance. For this reason, a potential difference is generated between the power-supply lines Vcc2 and Vcc1, or between the ground line $G_{ND}1$ and a ground line $G_{ND}2$ for the same reason. As a result, a current flows from the power-supply line Vcc1 to the ground line G through the ICs.

The power-supply line Vcc1 and the ground line G are farther from the ICs than the power-supply line Vcc2 and the ground line $G_{ND}1$. For this reason, when a current flows in the power-supply line and the ground line G, the cross-sectional area S of each of the loops shown FIGS. 4 and 5 increases.

The power-supply lines Vcc1 and Vcc2 are therefore connected to each other via a through hole 201 to make the potentials on these lines Vcc1 and Vcc2 approach the same potential near the ICs. Similarly, the ground lines $G_{ND}1$ and $G_{ND}2$ are connected via a through hole 202 to make the potentials on these lines $G_{ND}1$ and $G_{ND}2$ approach the same potential near the ICs.

With this arrangement, the current flowing in the ICs and the signal line 200 is supplied from the power-supply line nearest to the signal line 200, and flows to the ground line nearest to the signal line 200.

In addition, the power-supply and ground lines are arranged in a checkerboard form at a small pitch to reinforce the coupling between the lines, and high-frequency currents concentrate on the ICs and the signal line 200.

In addition, since the cross-sectional area S of the loop for a signal current can be decreased, the intensity of an emitted electromagnetic wave can be reduced.

Furthermore, by wiring a power-supply or ground line near a signal line, the mutual inductance between the signal and power-supply lines or between the signal and ground lines increases, thereby decreasing the impedance. This is because, currents flowing in opposite directions, like currents flowing in the signal and ground lines, prevent the effective inductance of the overall system from decreasing.

Letting L be the inductance of a line of a circuit pattern, C be the capacitance, and $Z_0$ be the impedance, $$Z_0=\{(R+j\omega L)/(G+j\omega C)\}^{1/2}$$

where R is the resistance and G is the conductance.

In a multilayer printed circuit board, ground patterns are formed on the entire surface of an arbitrary inner layer, and the cross-sectional area S of the loop is given by:

pattern length x interlayer thickness

When, however, the ground patterns are formed on the entire surface of an inner layer, a return current flows undesirably in an unintentional route in the patterns. For this reason, as described above, the lines on the printed circuit board and the lines constituted by the jumper lines are arranged into a checkerboard structure to control the current routes.

The method of removing noise mainly due to a magnetic field has been described above, which uses the design technique of decreasing the distance between power-supply lines (or ground lines) to decrease the cross-sectional area S of the loop in which a current flows.

A design technique of suppressing an electric field generated owing to the potential difference between two signal lines will be described below.

The variation amount of a potential (voltage variation) is determined by the change amount of a current and the inductance of a line. That is, a potential variation V is given by:

$$V=L\cdot(di/dt)$$

If this inductance L can be decreased, the potential variation between the two signal lines can be reduced to suppress the generation of an electric field that generates noise.

Figure 7:
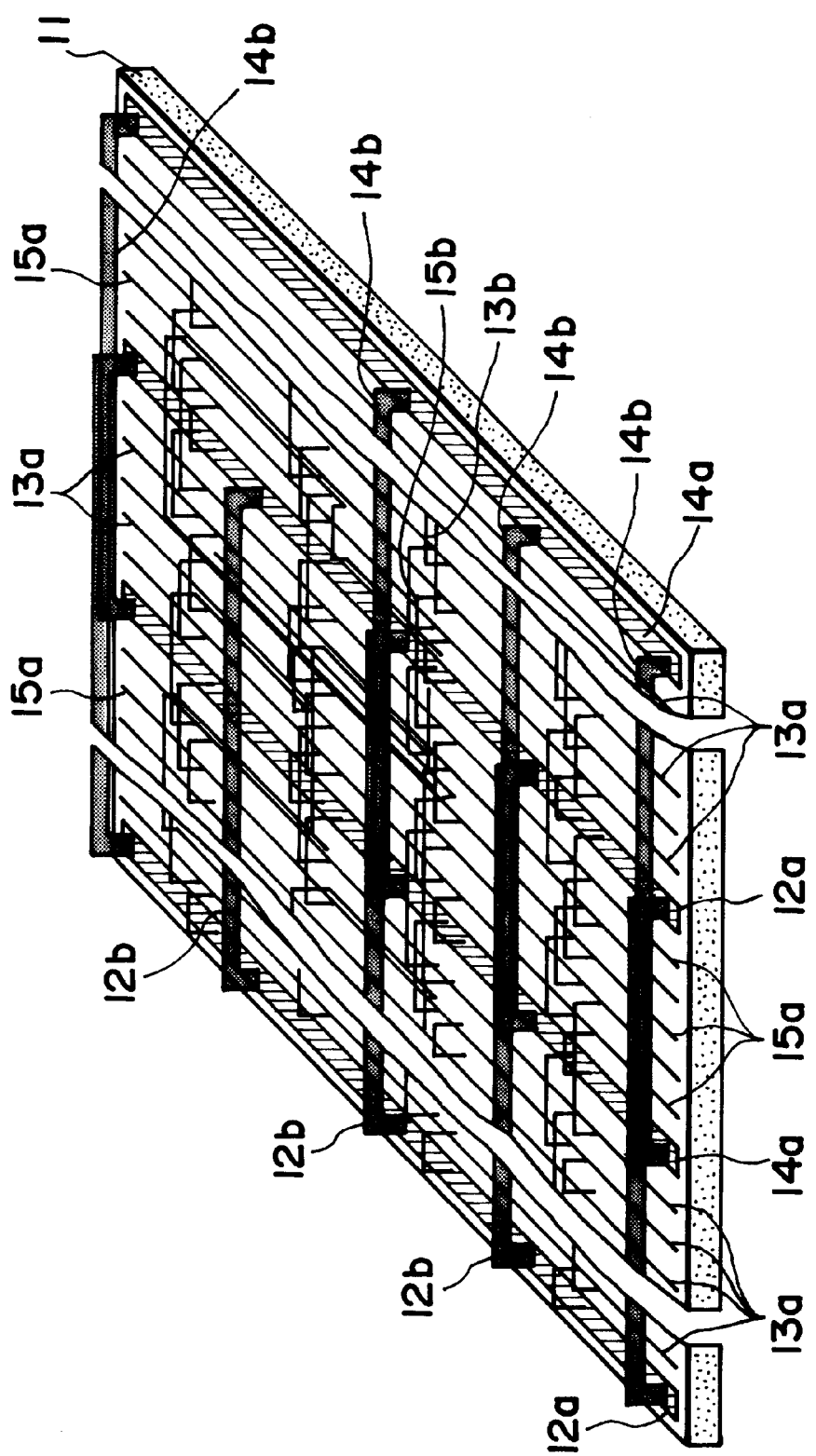
FIG. 7 is a perspective view showing a printed circuit board according to the embodiment of the present invention.
Figure 8:
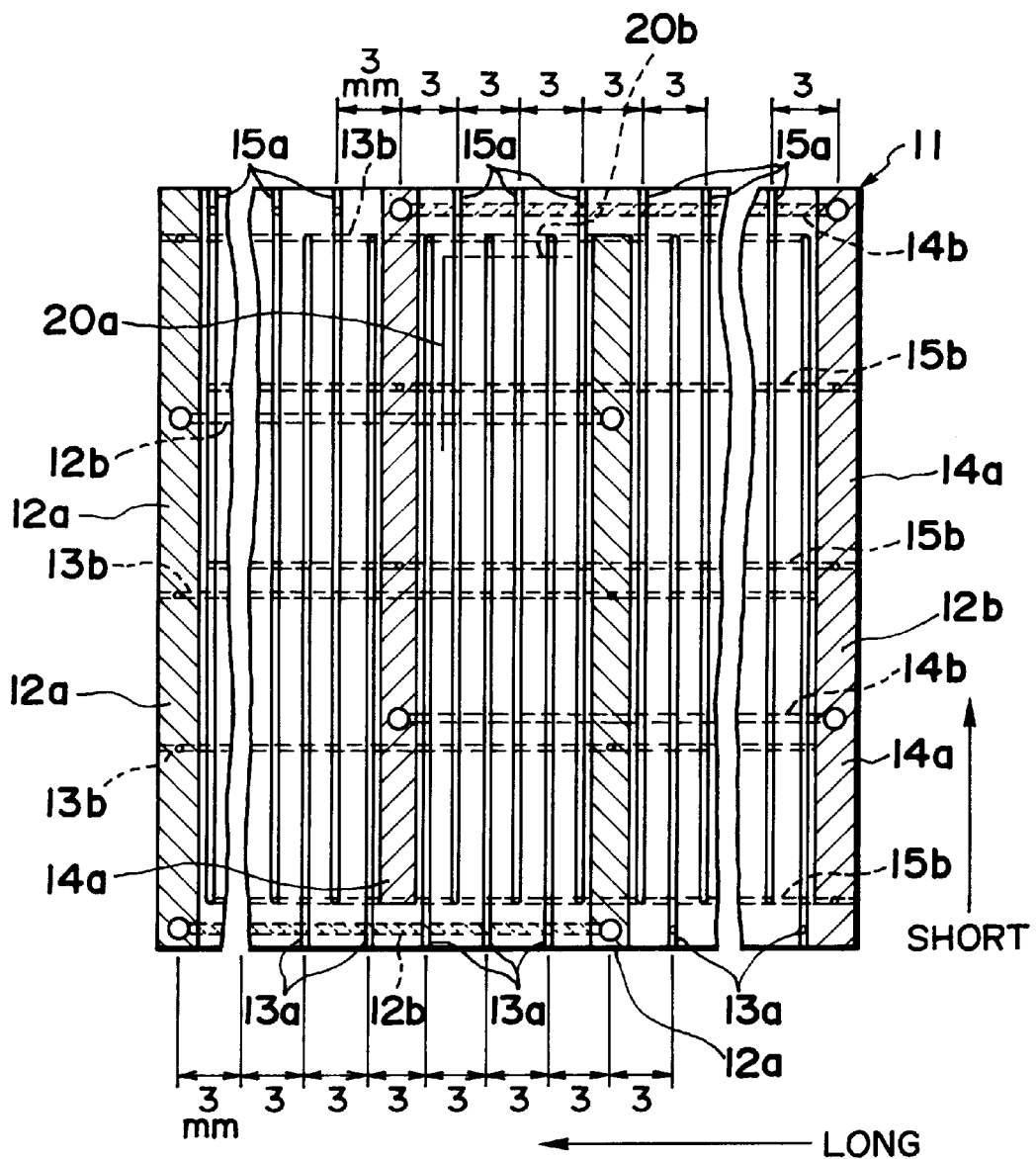
FIG. 8 is an enlarged view of the main part of the printed circuit board in FIG. 7.

In the printed circuit board having the checkerboard structure shown in FIGS. 7 and 8, since the impedances of the ground and power-supply lines can be decreased, the potential variation can be suppressed, and the level of the generated electromagnetic wave electric field can be suppressed low.

That is, in the printed circuit board of the present invention, emitted noise is suppressed by reducing the cross-sectional area S of the loop in which a current flows and reducing the potential difference between the patterns by reducing the inductances.

Design Based on Highest Frequency of Frequencies of Signals

In general, as a high-speed periodic signal like a clock signal, a signal with shorter times $t_r$ and $t_f$ is required as the frequency increases.

In order to obtain such a rectangular wave (pulse), the signal needs to contain up to about 50th harmonic components of the fundamental wave.

The interval of the lines in the checkerboard or matrix form must be designed in consideration of a frequency 50 times the highest frequency of the repeating frequencies of signals in the circuit.

If, for example, the highest frequency of the frequencies of operation clocks in the circuit or signals in the circuit is 30 MHz, the 50th harmonic component has a frequency of 1.5 GHz, and its wavelength is about 100 mm in consideration of a reduction in wavelength on the printed circuit board.

In order to prevent the generation of an emitted electromagnetic wave having a wavelength of about 100 mm, a printed circuit board may be designed on the basis of the times $t_r$ and $t_f$, and the signal line length or the matrix interval may be suppressed to (½)λ or less (i.e., 5 mm or less in this case) the wavelength.

Example of Design of Printed Circuit Board

A printed circuit board designed by the above design method will be described next with reference to FIGS. 7 and 8.

FIG. 7 is a perspective view showing the arrangement of a printed circuit board according to the present invention. FIG. 8 is an enlarged view showing the main part of the printed circuit board in FIG. 7.

Referring to FIGS. 7 and 8, the lines denoted by the reference numerals with suffix "a" are pattern lines on the printed circuit board, and the lines denoted by the reference numerals with suffix "b" are jumper lines.

Referring to FIG. 7, first power-supply lines 14*a* and first ground lines 12*a*, each having a large line width, are alternately formed on a printed circuit board 11 to extend in a direction perpendicular to the longitudinal direction.

Second power-supply lines 15*a* and second ground lines 13*a*, each having a small line width, are alternately formed between the first power-supply lines 14*a* and the first ground lines 12*a*, and the power-supply and ground lines are alternately arranged on the entire surface of the printed circuit board 11.

In this case, each of the first power-supply lines 14*a* and the first ground lines 12*a* preferably has a line width of 1 mm or more, more preferably about 2 mm, and each of the second power-supply lines 15*a* and the second ground lines 13*a* preferably has a line width less than 1 mm, more preferably about 0.3 mm. The power-supply are arranged at intervals of about 3 mm, and so are the ground lines. The power-supply and ground lines located adjacent thereto are therefore arranged at intervals of about 1.5 mm.

The jumper lines are mounted on the printed circuit board 11 to extend parallel to the longitudinal direction of the printed circuit board 11 (the direction perpendicular to the power-supply and ground lines on the printed circuit board 11) so as to connect the first power-supply lines 14*a* to the second power-supply lines 15*a* and also connect the first ground lines 12*a* to the second ground lines 13*a*.

In this case, the first power-supply lines 14a are connected to the second power-supply lines 15a through first jumper line power-supply lines 14b, each having a large line width, whereas the first ground lines 12a are connected to the second ground lines 13a through first jumper line ground lines 12b, each having a small line width.

The second power-supply lines 15a are connected to each other through second jumper line power-supply lines 15b, each having a small line width, and so are the first power-supply lines 14a and the second power-supply lines 15a. The second ground lines 13a are connected to each other through second jumper line ground lines 13b, each having a small line width, and so are the first ground lines 12a and the second ground lines 13a.

The power-supply lines using the patterns and the power-supply lines using the jumper lines are soldered and connected to each other in jumper line mounting holes (through holes) formed in the respective intersections, and so are the ground lines using the patterns and the ground lines using the jumper lines.

Referring to FIG. 8, the portions indicated by the solid lines indicate the lines formed on the printed circuit board 11, and the portions indicated by the dotted lines indicate the jumper lines. In addition, the hatched portions indicate the power-supply or ground lines each having a large line width.

In the structure shown in FIG. 8, the three second power-supply lines 15a and the three second ground lines 13a are formed between the first power-supply line 14a and the first ground line 12a.

In addition, a signal line 20a is formed on the printed circuit board 11, and a signal line 20b is formed by using a jumper line. These signal lines 20a and 20b are inserted and soldered in jumper line mounting holes to be electrically connected to each other.

Referring to FIG. 8, the small and large circles indicate the jumper line mounting holes. The small circles indicate the mounting holes used to connect thin lines having the same potential and connect thin lines to thick lines. The large circles indicate the mounting holes used to connect thick lines having the same potential.

In this arrangement, the power-supply and ground lines using the jumper lines are arranged at a pitch three to five times the interval (pitch) of the power-supply and ground lines formed on the printed circuit board 11.

When a pattern or jumper line formed on the printed circuit board 11 serves as an antenna for emitting noise, the emission efficiency of noise increases as the length of the line increases.

Since especially the jumper lines arranged in the longitudinal direction of the printed circuit board become long, the respective lines may be connected to patterns formed at short intervals in the direction perpendicular to the jumper lines to divide the jumper lines into many short antennas, thereby suppressing the antenna efficiency.

In contrast to this, since the lines formed on the printed circuit board are arranged in the direction perpendicular to the longitudinal direction and short, the antenna efficiency is low. For this reason, these lines need not be divided as fine as the patterns (jumper lines) in the longitudinal direction.

If the jumper lines are coated with a material having a large dielectric constant, the dielectric constant between the jumper lines increases, and the jumper lines are electromagnetically coupled to each other more strongly. This effect is equivalent to the effect obtained when the interval of the jumper lines decreases. In this case, the power-supply and ground lines using the jumper lines can be arranged at a pitch five to ten times the interval (pitch) of the power-supply and ground line lines formed on the printed circuit board 11.

By setting the pitch of the power-supply and ground lines using the jumper lines to be three to five times that of the lines on the printed circuit board in this manner, the spaces for signal lines can be ensured without excessively increasing the number of jumper lines, thus efficiently suppressing noise emission. In addition, the numbers of vertical and horizontal signal lines on the printed circuit board 11 can be kept in balance.

Figure 9:
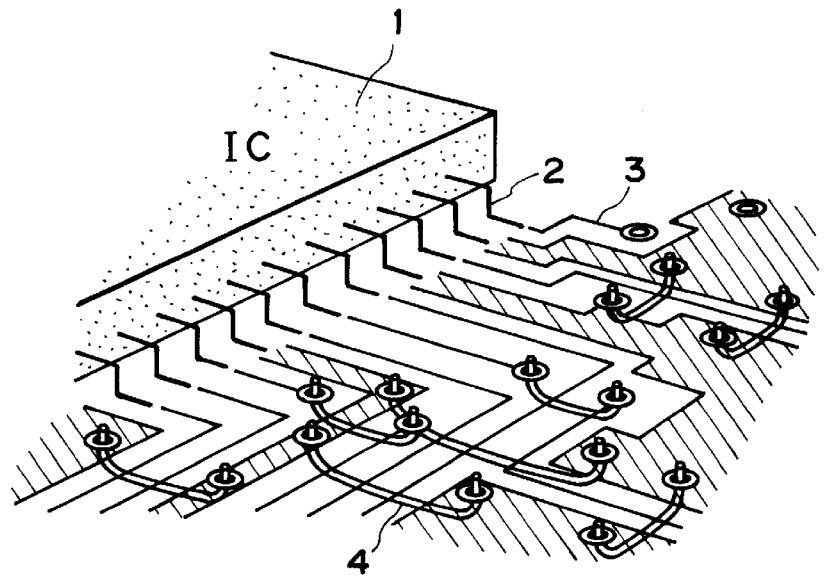
FIG. 9 is a perspective view showing a wiring layout around an IC on the printed circuit board according to the embodiment.
Figure 10:
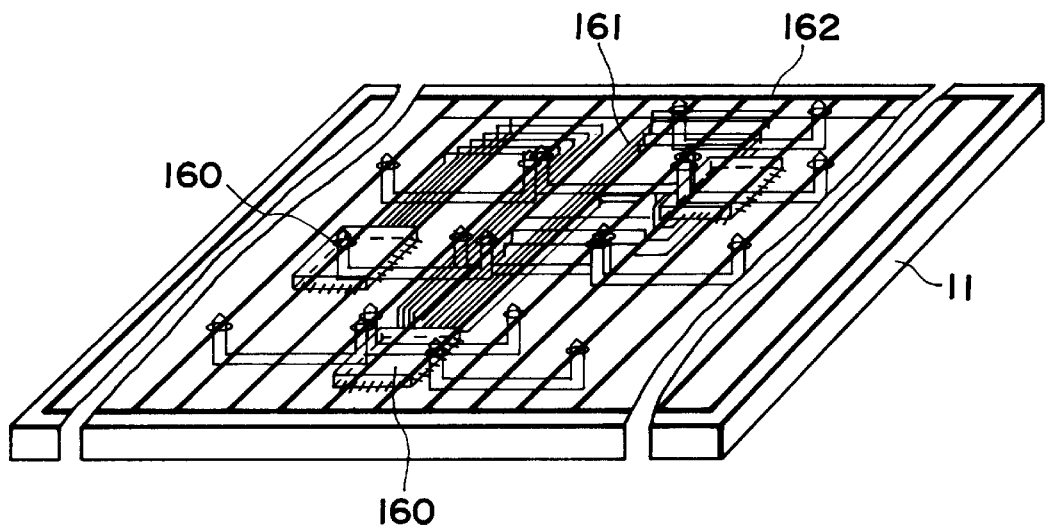
FIG. 10 is a perspective view showing how an IC is mounted on the printed circuit board according to the embodiment.

An example of the layout of signal lines on a printed circuit board will be described next with reference to FIGS. 9 and 10. FIG. 9 is an enlarged view showing the main part of a wiring arrangement around an IC on the printed circuit board. FIG. 10 is a perspective view showing how ICs are mounted on the printed circuit board.

Referring to FIG. 9, patterns 3 are respectively connected to leads 2 of an IC 1 mounted on the printed circuit board. The patterns 3 are connected to each other through jumper lines 4, as needed.

Referring to FIG. 10, ICs 160 are mounted on the printed circuit board 11, and patterns 162, each having a large line width and serving as a power-supply or ground line, are formed. The ICs 160 are electrically connected to each other through signal lines 161.

As described above, the interval of the power-supply and ground lines formed on the printed circuit board 11 is 1.5 mm. If, for example, the line width of each signal line is about 0.15 mm, a maximum of about four to five signal lines can be formed between the power-supply and ground lines, as shown in FIG. 10. Any signal line is therefore placed within a distance of 1.5 mm from the power and ground lines.

In the printed circuit board 11 having the above arrangement, therefore, the area of a loop constituted by signal and ground lines or by signal and power-supply lines is small. For this reason, the magnetic flux generated by this loop is reduced, and the intensity of the emitted electromagnetic wave decreases.

In addition, since the impedance formed by the lines decreases, the intensity of the electric field generated on the printed circuit board decreases.

The emitted noise is therefore suppressed to reduce malfunctions in the system.

(Effects Obtained by Use of Both Thick and Thin Lines)

Figure 11A:
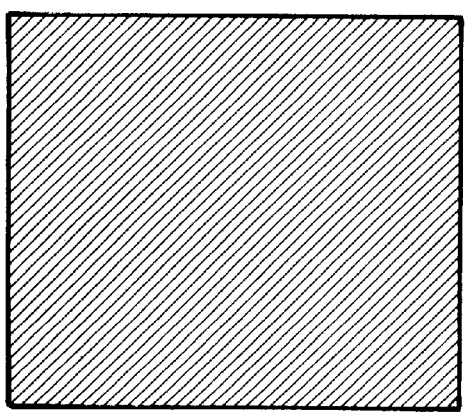
Figure 11D:
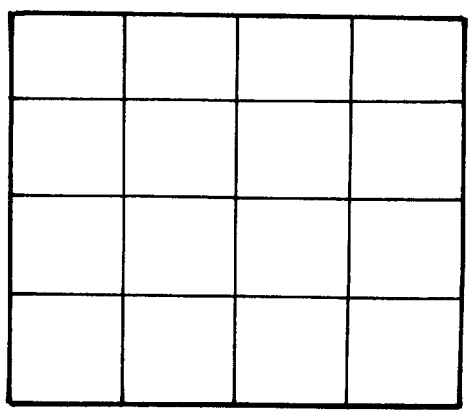
Figure 11B:
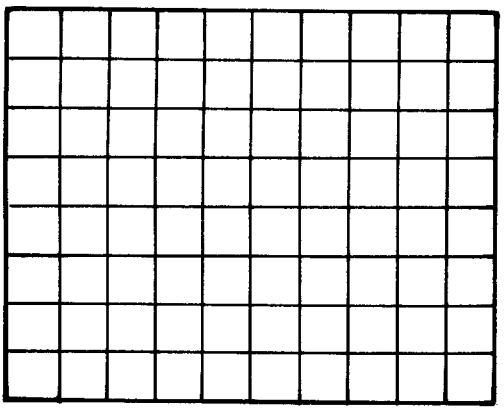
Figure 11C:
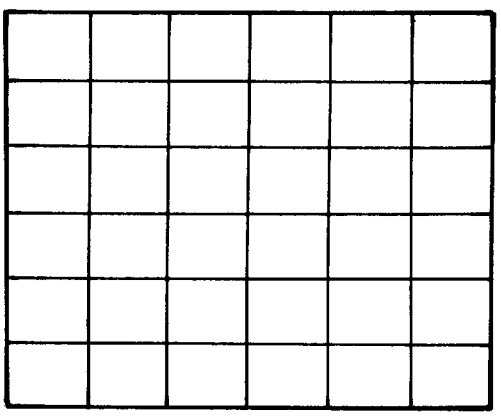

FIGS. 11A to 11D show the layouts obtained when the interval of the power-supply and ground lines on the printed circuit board shown in FIG. 7 is changed. FIG. 11A is a plan view showing the layout obtained when the interval is about 0 mm. FIG. 11B is a plan view showing the layout obtained when the interval is about 3 mm. FIG. 11C is a plan view showing the layout obtained when the interval is 9 mm. FIG. 11D is a plan view showing the layout obtained when the interval is 15 mm.

Figure 12:
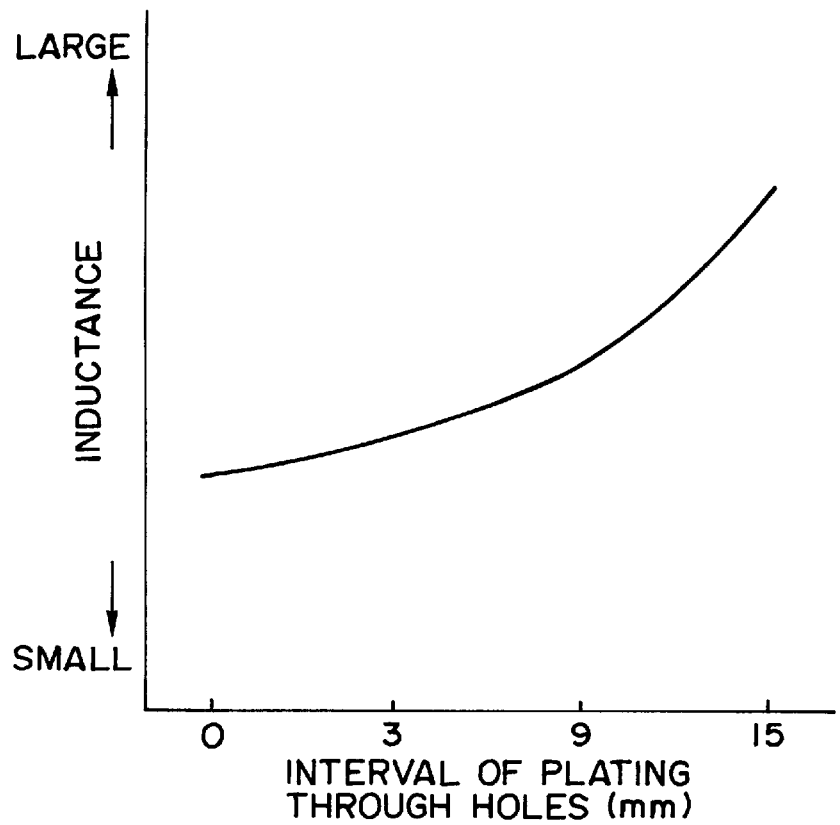
FIG. 12 is a graph showing changes in inductance with changes in the interval between ground lines on the printed circuit board according to the embodiment.
Figure 13:
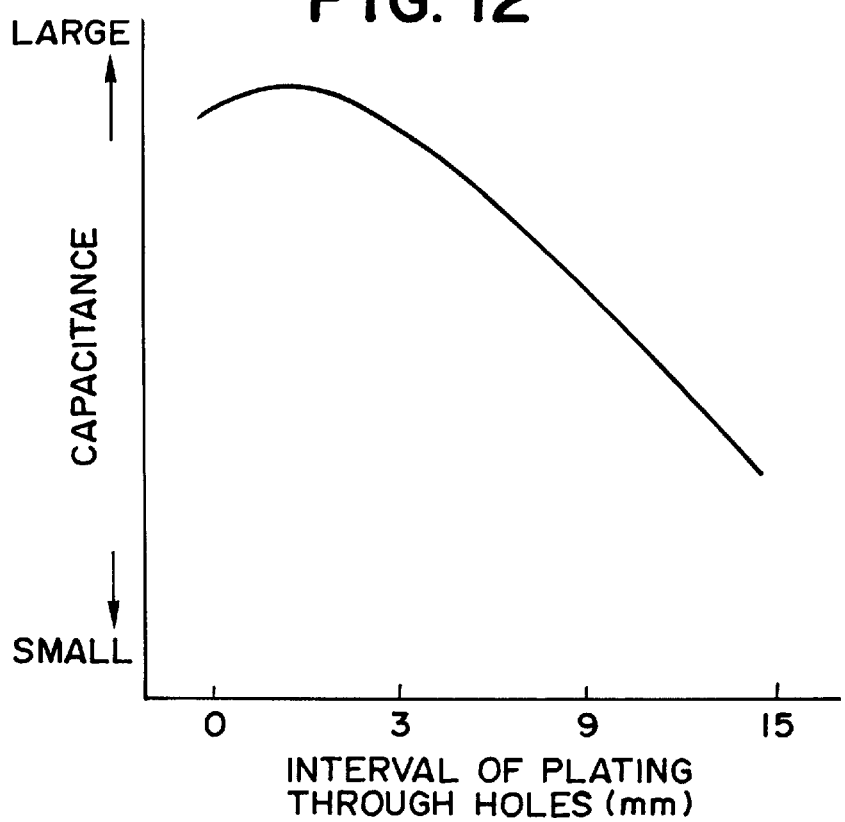
FIG. 13 is a graph showing changes in the capacitance between power-supply and ground lines with changes in the distance between the power-supply and ground lines on the printed circuit board according to the embodiment.
Figure 14:
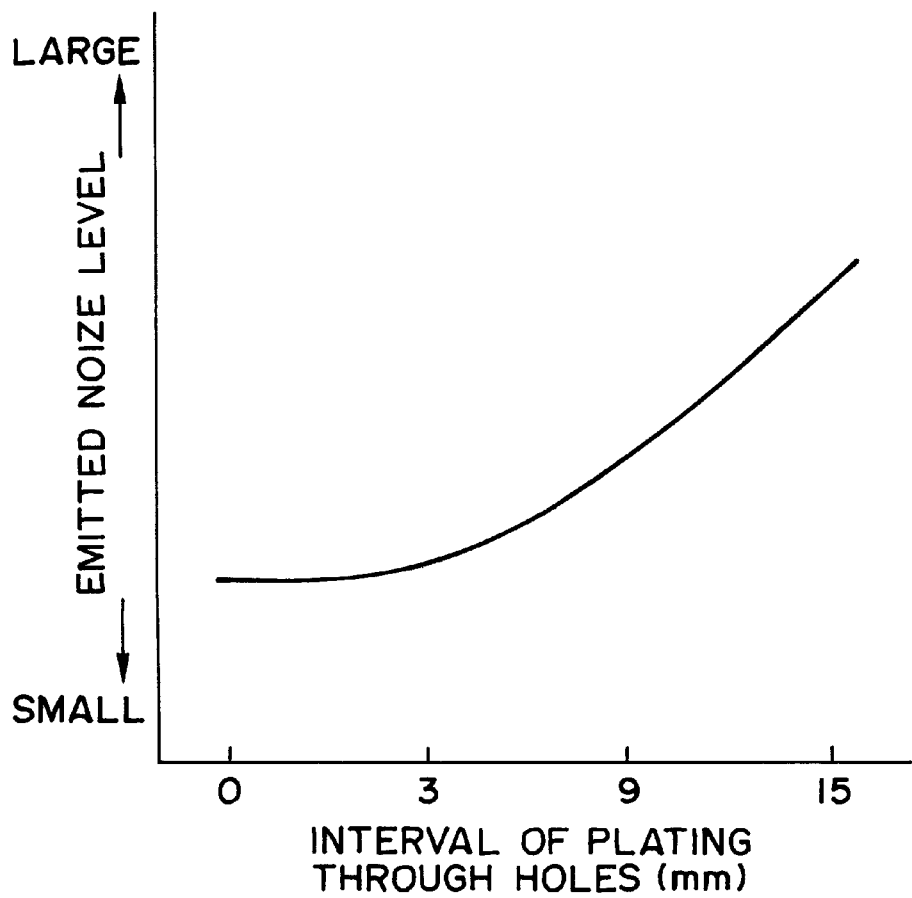
FIG. 14 is a graph showing changes in emitted noise generated by a current flowing in a ground line with changes in the distance between the power-supply and ground lines on the printed circuit board according to the embodiment.

FIG. 12 is a graph showing changes in inductance with changes in the interval of the ground lines. FIG. 13 is a graph showing changes in the capacitance between the power-supply and ground lines with changes in the interval of the power-supply and ground lines. FIG. 14 is a graph showing changes in the emitted noise generated by the current flowing in the ground line with changes in the interval of the power-supply and ground lines.

As shown in FIGS. 12 to 14, the characteristics obtained when the interval of the jumper line mounting hole portions is set to about 3 mm are similar to those obtained when the interval of the jumper line mounting hole portions is set to 0 mm as in surface grounding.

As in the printed circuit board 11 shown in FIG. 7, if the interval of the second ground line 13a, the second jumper line ground line 13b, the second power-supply line 15a, and the second jumper line power-supply line 15b is set to 5 mm or less, preferably about 3 mm, the inductance at high frequencies can be reduced.

On the printed circuit board 11 shown in FIG. 7, both lines having large and small line widths used for the ground and power-supply lines.

As described above, a line having a small line width decreases the inductance at high frequencies, and allows a small-size checkerboard structure because of the small line width. The cross-sectional area of a loop in which a current flows can therefore be decreased, and emitted noise can be suppressed.

On the other hand, a line having a large line width ensures a sufficient DC current capacity, and decreases the inductance at low frequencies.

If, therefore, the first ground lines 12a, the first jumper line ground lines 12b, the first power-supply lines 14a, and the first jumper line power-supply lines 14b are formed such that each line has a line width of 1 mm or more, sufficient current capacities for currents flowing in these lines can be ensured, and the inductance at low frequencies can be reduced.

By using two types of lines having different line widths in this manner, complementary effects can be obtained.

In the above case, the line widths of the second ground lines 13a, the second jumper line ground lines 13b, the second power-supply lines 15a, and the second jumper line power-supply lines 15b are set to about 0.3 mm. However, if the line widths remain below 1 mm, the quality of the layout of signal lines is not impaired.

Other Effects (1) A single-sided printed circuit board has ground lines formed only on the surface layer. As the frequency of the current increases, the current flows only through the surface of each ground line owing to the skin effect. For this reason, the impedance of a high-frequency signal does not decrease regardless of the thickness of a copper foil as a ground line pattern.

According to the printed circuit board of the present invention, the ground patterns are formed to have a matrix or checkerboard structure by using patterns and jumper lines on the printed circuit board. For this reason, return currents flow to the ground patterns through many routes formed in parallel. As a result, the high-frequency impedance of all the ground patterns on the printed circuit board decreases.

(2) In general, since the ground patterns formed on the printed circuit board are not ideal ground patterns, a certain inductance always exists. If, therefore, a return current flows in the ground pattern, a voltage spike is induced by this inductance, and a ground bounce is generated.

On the printed circuit board of the present invention, the ground patterns are formed to have a matrix or checkerboard structure by using ground and jumper lines. For this reason, the inductance of each ground pattern decreases, and the voltage spike decreases. As a result, the ground bounce is reduced.

(3) The voltage waveform of a digital signal is a pulse-like rectangular waveform. When the output impedance of an IC is lower than the characteristic impedance of a signal line, damped oscillations called ringing are generated in the flat portion of the rectangular wave. This ringing can be reduced by reducing the characteristic impedance of the signal line.

Since the ground patterns are formed on the printed circuit board of the present invention into a matrix or checkerboard structure by using ground and jumper lines, the coupling capacitances of the signal and ground lines increase, and the characteristic impedance of each signal line decreases. As a result, the ringing in the pulse decreases.

(4) When a plurality of signal lines are arranged to be close and parallel to each other, crosstalk occurs due to the capacitive coupling or induction coupling between the signal lines. In order to minimize the coupling capacitance between the signal lines, the distance between the signal and ground lines must be minimized.

Since the distance between the signal and ground lines on the printed circuit board of the present invention is shorter than that on the conventional printed circuit board, the coupling capacitance between the signal lines decreases to reduce the crosstalk.

The magnitude of the crosstalk caused by induction coupling is proportional to the cross-sectional area of a loop which is constituted by signal and ground lines and in which a current flows. That is, the intensity of the induction coupling increases as the size of the loop increases. The distance between the signal and ground lines must therefore be decreased to reduce the size of the loop.

Similar to the case of the coupling capacitance described above, the intensity of the induction coupling decreases to reduce the crosstalk on the printed circuit board of the present invention because the distance of the signal and ground lines thereon is shorter than that on the conventional printed circuit board.

(5) The intensity of an electromagnetic wave emitted noise generated from a printed circuit board is proportional to the cross-sectional area of a loop which is constituted by a current flowing in the signal line and a return current flowing in the ground line.

If, therefore, a ground layer is formed as an inner layer as in a multilayer board, since the ground layer is present immediately under the signal lines, the above loop is small in size. On a general single-sided printed circuit board, however, ground patterns and single lines are formed as a single layer, resulting in a relatively large inductance. Owing to this inductance, return currents to the ground lines not only flow near the signal lines but also spread/flow over the entire printed circuit board. The electromagnetic wave emitted noise can be reduced by reducing the spread of the return currents.

On the printed circuit board of the present invention, the ground lines are formed into a matrix or checkerboard structure, and the distance between the signal and ground lines is short. As a result, the inductance decreases. For this reason, the electromagnetic wave emitted noise can be reduced.

(6) As an electrostatic test, the following test is conducted. A high-voltage pulse is applied to a printed circuit board (e.g., the I/O connector) on which parts are mounted, and it is checked whether the circuit malfunctions.

With the use of a structure like that of the printed circuit board of the present invention, the coupling capacitance between the signal and ground lines increases. If, therefore, a high-voltage (Q) externally applied to the printed circuit board is constant as indicated by V=Q/C, since the capacitance (C) of the board is large, the induced voltage (V) is low. As a result, voltage variations are reduced, and the frequency of occurrence of circuit malfunctions decreases.

(7) On the printed circuit board of the present invention, signal lines can be formed between the power-supply patterns and the ground patterns without disturbing the layout of the power-supply and ground patterns. Therefore, a stable printed circuit board with small variations in the inductance distributions of the power-supply and ground patterns can be manufactured.

The time and cost required for countermeasures against emitted noise and malfunction analysis can be greatly reduced.

Assume that there is no space for mounting extra parts for suppressing noise as in a case wherein parts are mounted in a limited space at a high density, or the area for power-supply and ground patterns cannot be ensured on a printed circuit board like a portable computer or the like. Even in this case, the printed circuit board of the present invention allows high-density mounting of parts while reducing the emitted noise.

Example of Design of Printed circuit board Using Electronic Parts in place of Jumper Lines In the above case, the jumper lines are formed into a checkerboard structure. The checkerboard structure of the power-supply system suppresses noise by decreasing the antenna efficiency rather than controlling the current itself. If, therefore, the current serving as a noise source is excessively large, the above structure may not satisfactorily function.

In the following case, lossy electronic parts are used as jumper members for bridging lines.

Figure 15:
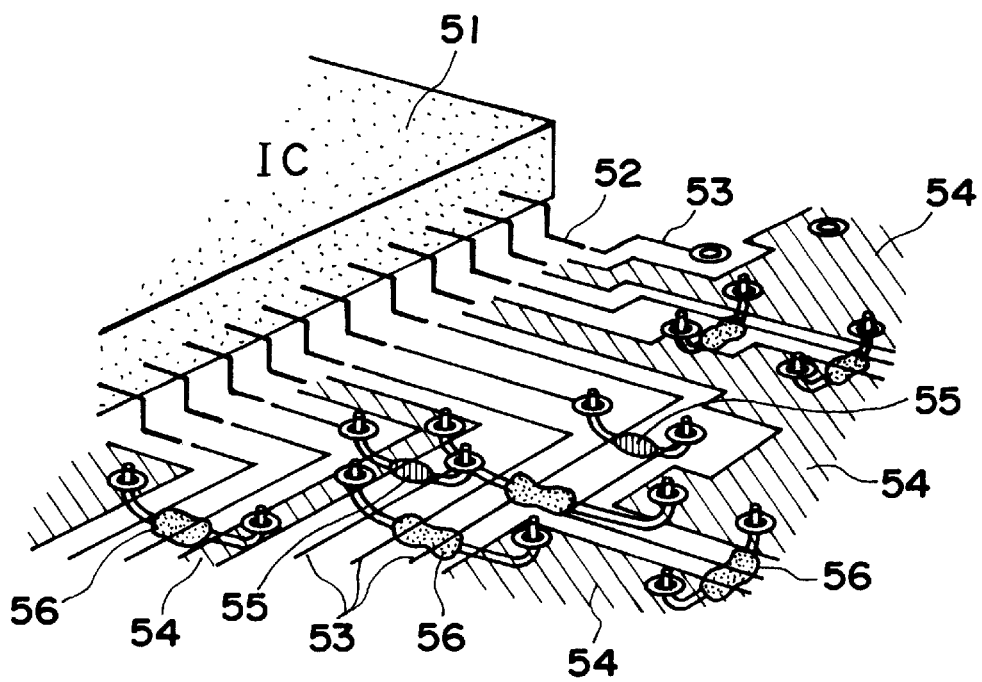
FIG. 15 is a perspective view showing a wiring layout around an IC on the printed circuit board according to the embodiment, in which the lines are bridged through lossy electronic parts.

FIG. 15 is an enlarged view showing a wiring layout around an IC on a printed circuit board on which the lines are bridged by lossy electronic parts.

Referring to FIG. 15, signal lines 53 and power-supply (power-supply/ground) lines 54 are connected to leads 52 of an IC 51 mounted on a single-sided printed circuit board. The signal lines 54 are bridged and connected through lead-type damping resistors 55. The power-supply lines 54 are bridged and connected through lead-like ferrite beads inductors 56. That is, the damping resistors 55 and the ferrite beads inductors 56 are used as jumper members.

The damping resistors 55 and the ferrite beads inductors 56 convert unwanted high-frequency currents into heat and radiate it, and hence cause no resonance at any special frequencies. As a result, emitted electromagnetic waves that cause noise can be suppressed. In this case, since emitted electromagnetic waves are suppressed by converting unwanted high-frequency currents into thermal energy, the constants of the damping resistors 55 and the ferrite beads inductors 56 are preferably minimized to convert unwanted high-frequency currents to higher thermal energy. If, however, the constants are excessively large, a power-supply voltage drop may occur in each power-supply line 54, and the waveform of a signal on each signal line 53 may become blunt, hampering a normal operation of the printed circuit board. Therefore, as the ferrite beads inductor 56, an inductor whose constant is maximized within the allowable range based on the power-supply drop is preferably used. As the damping resistor 55, a resistor whose constant is maximized within the range in which no malfunction occurs due to a blunt signal waveform is preferably used.

Figure 16:
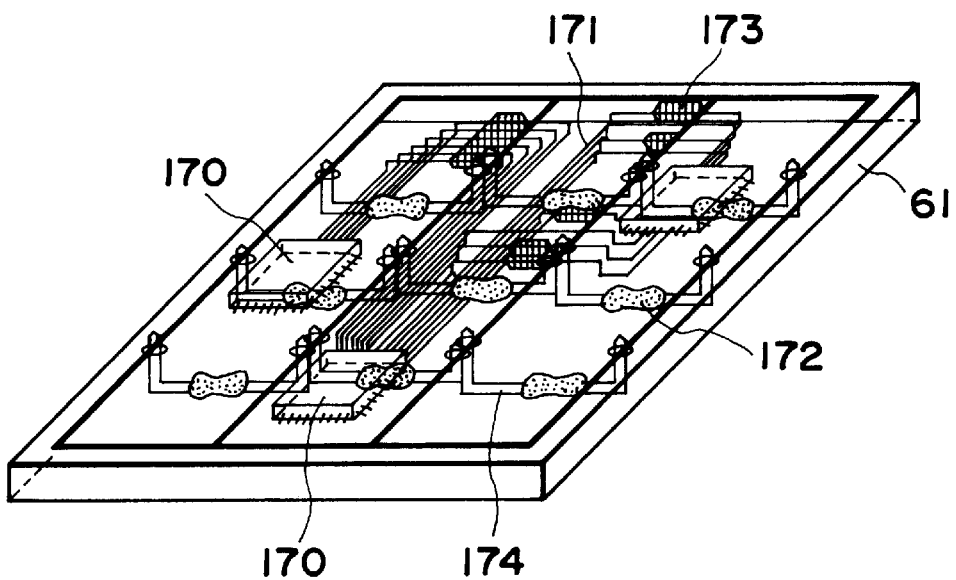
FIG. 16 is a perspective view showing an example of how power-supply lines are wired in a checkerboard form through lossy electronic parts on the printed circuit board according to the embodiment.
Figure 17:
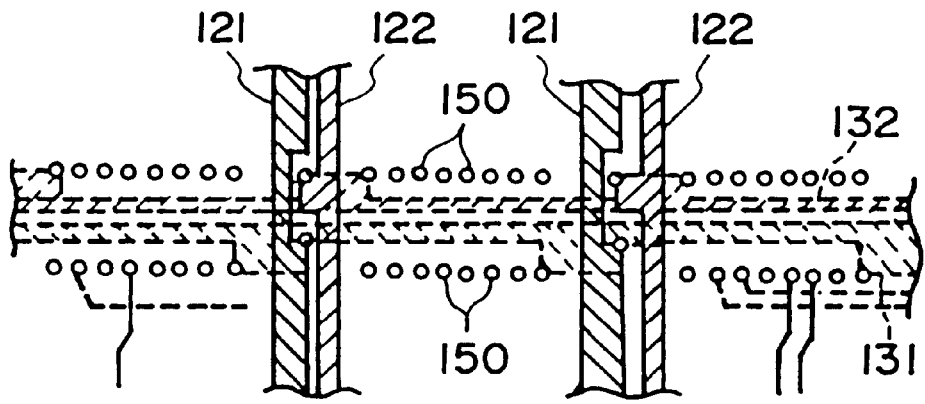
FIG. 17 is a view showing an example of the layout of patterns which can be formed on a conventional printed circuit board.
Figure 18:
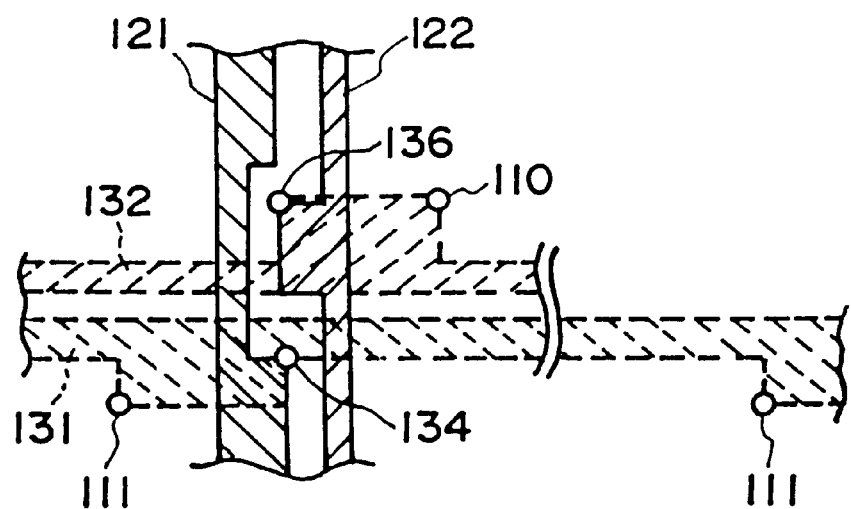
FIG. 18 is an enlarged view of the main part of the patterns in FIG. 17.

FIG. 16 is a perspective view showing a printed circuit board on which power-supply lines are wired in a checkerboard form by using lossy electronic parts.

Referring to FIG. 16, a plurality of power-supply lines 172 are arranged parallel at a predetermined pitch on a single-sided printed circuit board 61 on which ICs 170 are mounted. The adjacent power-supply lines 172 are bridged and connected to each other through lead-type ferrite beads inductors 174 which are perpendicular to the power-supply lines 172 and arranged at a predetermined pitch. In addition, a plurality of signal lines 171 for electrically connecting the ICs 170 are formed parallel to the power-supply lines 172. The signal lines 171 are bridged and connected to each other through lead-type damping resistors 173 arranged to be perpendicular to the signal lines 171.

When the power-supply lines 172 and the ferrite beads inductors 174 are formed into a matrix or checkerboard structure in this manner, the number of current routes increases to reduce the impedance. As a result, the intensity of the electric field generated on the printed circuit board 61 decreases to further suppress the emitted noise. In addition, since the ferrite beads inductors 174 are arranged at the predetermined pitch to form a matrix or checkerboard structure of lines, together with the ferrite beads inductors 174, the printed circuit board 61 is stable with small variations in loss caused by the ferrite beads inductors 174.

In the cases shown in FIGS. 15 and 16, the ferrite beads inductors 56 and 174 are used to convert unwanted high-frequency current components flowing in the power-supply lines 54 and 172 into thermal energy and radiate it. However, resistors having as large a constat as possible can also be used effectively within the allowable range based power-supply voltage drops. In contrast to this, the damping resistors 55 and 173 are used for the signal lines 53 and 171. If, however, parts having excessively large constants are used for the signal lines 53 and 171, the signal waveform becomes blunt. For this reason, a ferrite beads inductor that efficiently reduces only high-frequency components can also be used effectively for a critical signal line.

As the density of wiring patterns on a printed circuit board increases, the distance between the signal lines or the power-supply lines to be bridged and connected to each other decreases. For this case, a lead-type part may not be used as a lossy electronic part. In such a case, a chip-type electronic part or a printed part formed by printing resistive or conductive elements on a printed circuit board can be used.

The above method is a method of designing a single-sided printed circuit board. However, the present invention can also be applied to a double-sided printed circuit board and a multilayer printed circuit board.

As has been described in detail above, according to the present invention, the noise frequency in question which is generated from a circuit is determined, and the distance between two arbitrary power-supply lines of the plurality of power-supply lines extending parallel to each other is determined on the basis of the determined noise frequency in question. The distance between jumper lines for bridging the two arbitrary power-supply lines is determined on the basis of the noise frequency in question. The emitted noise that can be generated on the printed circuit board can be suppressed.

More specifically, according to the single-sided wiring board of the present invention, power-supply and ground lines are formed on the board at predetermined intervals in different directions by using wiring patterns and jumper lines. The intersections of these lines are then soldered and connected to each other in jumper line mounting hole portions to make the inductances of the power-supply and ground patterns uniform. As a result, the capacitance between the power-supply and ground patterns or between the signal patterns increases to suppress the emitted noise.

Since the power-supply and ground lines are arranged in the form of a matrix, the number of current routes increases, and the impedance decreases. In addition, the inductances are made uniform, and the capacitances between the power-supply and ground lines and between the signal and power-supply and ground lines increase. For this reason, the intensity of the electric field generated on the printed circuit board decreases, and the emitted noise is suppressed.

In addition, by setting the pitch of the power-supply and ground lines using the jumper lines to be three to five times that of the lines on the printed circuit board, the spaces for the signal lines can be ensured without excessively increasing the number of jumper lines, thereby efficiently suppressing the emitted noise. If the jumper lines are coated with a material having a large dielectric constant, and the pitch of the jumper lines is set to be five to 10 times that of the lines on the printed circuit board, in particular, larger spaces can be ensured for the signal lines.

Furthermore, by arranging the signal lines between the power-supply and ground lines formed on the printed circuit board, the signal lines can be arranged without disturbing the layout of the power-supply and ground lines. A stable printed circuit board can therefore be obtained, on which the inductance distributions of the power-supply and ground lines are uniform.

Since the power-supply and ground lines are formed by using thick lines, each having a current capacity for the maximum DC current flowing in the circuit, and thin lines that reduce the occupied area, there is provided a printed circuit board which is free from the problem arising from a current capacity shortage, efficiently suppresses low- and high-frequency inductances, and causes little emitted noise.

The printed circuit board using lossy electronic parts as the jumper members for bridging and connecting the power-supply and signal lines to each other can suppress emitted noise by radiating unwanted high-frequency components flowing in the power-supply and signal lines as thermal energy.

In this case, when a plurality of power-supply lines are arranged parallel at equal intervals, and a plurality of electronic parts are arranged at equal intervals in a direction perpendicular to the power-supply lines, the intensity of the electric field generated on the printed circuit board decreases, thereby effectively suppressing emitted noise. In addition, when parts having large constants within the range in which the operation of the printed circuit board is not influenced are used as lossy electronic parts, unwanted high-frequency current components can be converted into thermal energy more efficiently. In addition, by using chip-type parts or parts directly formed on the printed circuit board, the wiring density of power-supply and signal lines can be increased.

What is claimed is:

1. A method of designing a printed circuit board having a plurality of power-supply lines extending parallel to each other, a plurality of signal lines extending parallel to each other, and jumper lines for bridging two arbitrary power-supply lines of said plurality of power-supply lines, comprising:

a step (a) of determining a radiation noise frequency;

a step (b) of determining a distance between said two arbitrary power-supply lines on the basis of the determined radiation noise frequency; and a step (c) of determining a distance between said jumper lines in accordance with the determined noise, wherein the noise frequency which is determined in step (a) is corrected by a dielectric constant of a material for said printed circuit board.

2. A method of designing a printed circuit board having a plurality of power-supply lines extending parallel to each other, a plurality of signal lines extending parallel to each other, and jumper lines for bridging two arbitrary power-supply lines of said plurality of power-supply lines, comprising:

a step (a) of determining a noise frequency;

a step (b) of determining a distance between said two arbitrary power-supply lines on the basis of the determined noise frequency; and a step (c) of determining a distance between said jumper lines in accordance with the determined noise, wherein said step (a) comprises a step of determining a frequency of a high harmonic component which is to be contained in a signal flowing in the printed circuit board at the noise frequency.

3. A method according to claim 2, wherein said step (c) comprises a step of setting the distance between said jumper lines to be three to five times the distance between said two arbitrary power-supply lines.

4. A method of designing a printed circuit board having a plurality of power-supply lines extending parallel to each other, a plurality of signal lines extending parallel to each other, and Jumper lines for bridging two arbitrary power-supply lines of said plurality of power-supply lines, comprising:

a step (a) of determining a radiation noise frequency;

a step (b) of determining a distance between said two arbitrary power-supply lines on the basis of the determined radiation noise frequency; and a step (c) of determining a distance between said jumper lines in accordance with the determined noise, wherein said step (a) comprises a step of determining the noise frequency on the basis of rise time characteristics or fall time characteristics of an IC element mounted on said printed circuit board.

5. A method of designing a printed circuit board having a plurality of power-supply lines extending parallel to each other, a plurality of signal lines extending parallel to each other, and Jumper lines for bridging two arbitrary power-supply lines of said plurality of power-supply lines, comprising:

a step (a) of determining a radiation noise frequency;

a step (b) of determining a distance between said two arbitrary power-supply lines on the basis of the determined radiation noise frequency; and a step (c) of determining a distance between said jumper lines in accordance with the determined noise.

wherein said step (b) comprises a step of determining about ½ a wavelength corresponding to the noise frequency, which is determined in said step (a), as the distance.

6. A method of designing a printed circuit board having a plurality of power-supply lines extending parallel to each other, a plurality of signal lines extending parallel to each other, and jumper lines for bridging two arbitrary power-supply lines of said plurality of power-supply lines, comprising:

a step (a) of determining a radiation noise frequency;

a step (b) of determining a distance between said two arbitrary power-supply lines on the basis of the determined radiation noise frequency:

a step (c) of determining a distance between said jumper lines in accordance with the determined noise; and a step (d) of arranging said signal lines between said power-supply lines, said power-supply lines having a plurality of power feed lines and a plurality of power return lines, and said power feed lines and said power return lines being alternately arranged parallel to each other.

7. A method according to claim 6, further comprising a step of forming said plurality of power feed lines and said plurality of power return lines using thick lines, each having a current capacity corresponding to a maximum current flowing in a circuit, and thin lines which reduce an occupied area, said thick lines being arranged to sandwich at least two of said thin lines.

8. A method according to claim 7, further comprising a step of forming said thick lines to have a width of not less than 1 mm, and said thin lines to have a width of less than 1 mm.

9. A method of designing a printed circuit board having a plurality of power-supply lines extending parallel to each other, a plurality of signal lines extending parallel to each other, and jumper lines for bridging two arbitrary power-supply lines of said plurality of power-supply lines, comprising:
   a step (a) of determining a radiation noise frequency;
   a step (b) of determining a distance between said two arbitrary power-supply lines on the basis of the determined radiation noise frequency; and
   a step (c) of determining a distance between said jumper lines in accordance with the determined noise.
wherein
   said printed circuit board is a single-sided printed circuit board, and
   said signal lines are arranged between said power-supply lines to extend along a direction of width of said printed circuit board, while said jumper lines are arranged in a direction perpendicular to said power-supply lines.

10. A printed circuit board having a plurality of power-supply lines extending parallel to each other, a plurality of signal lines extending parallel to each other and jumper lines for bridging two arbitrary power-supply lines, wherein
   a distance between arbitrary power-supply lines of said plurality of power-supply lines is determined on the basis of a noise frequency on said printed circuit board, and
   a distance between said jumper lines is determined on the basis of the noise frequency in question on said printed circuit board, wherein
   the noise frequency is determined on the basis of a frequency of a high harmonic component which is to be contained in a signal flowing in the printed circuit board.

11. A board according to claim 10, wherein said jumper lines are arranged at a pitch three to five times the distance between said two arbitrary power-supply lines.

12. A board according to claim 11, wherein said jumper lines are coated with a material having a large dielectric constant.

13. A printed circuit board having a plurality of power-supply lines extending parallel to each other, a plurality of signal lines extending parallel to each other and jumper lines for bridging two arbitrary power-supply lines, wherein
   a distance between two arbitrary power-supply lines of said plurality of power-supply lines is determined on the basis of a radiation noise frequency on said printed circuit board, and
   a distance between said jumper lines is determined on the basis of the radiation noise frequency in question on said printed circuit board, wherein
   the noise frequency is determined on the basis of rise time characteristics or fall time characteristics of an IC element mounted on said printed circuit board.

14. A printed circuit board having a plurality of power-supply lines extending parallel to each other, a plurality of signal lines extending parallel to each other and jumper lines for bridging two arbitrary power-supply lines, wherein
   a distance between two arbitrary power-supply lines of said plurality of power-supply lines is determined on the basis of a radiation noise frequency on said printed circuit board, and
   a distance between said jumper lines is determined on the basis of the radiation noise frequency in question on said printed circuit board, wherein
   the noise frequency is corrected in accordance with a dielectric constant of said printed circuit board, and a length about ½ of a corrected wavelength is determined as a distance between the power-supply lines.

15. A printed circuit board having a plurality of power-supply lines extending parallel to each other, a plurality of signal lines extending parallel to each other and jumper lines for bridging two arbitrary power-supply lines, wherein
   a distance between two arbitrary power-supply lines of said plurality of power-supply lines is determined on the basis of a radiation noise frequency on said printed circuit board, and
   a distance between said jumper lines is determined on the basis of the radiation noise frequency in question on said printed circuit board, wherein
   said signal lines are arranged between said power-supply lines, said power-supply lines having a plurality of power feed lines and a plurality of power return lines, and said power feed lines and said power return lines being alternately arranged parallel to each other.

16. A board according to claim 15, wherein said plurality of power feed lines and said plurality of power return lines are formed by using thick lines, each having a current capacity corresponding to a maximum current flowing in a circuit, and thin lines which reduce an occupied area, said thick lines being arranged to sandwich at least two of said thin lines.

17. A board according to claim 16, wherein said thick line is formed to have a width of not less than 1 mm, and said thin lines are formed to have less than 1 mm.

18. A printed circuit board having a plurality of power-supply lines extending parallel to each other, a plurality of signal lines extending parallel to each other and jumper lines for bridging two arbitrary power-supply lines, wherein
   a distance between two arbitrary power-supply lines of said Plurality of power-supply lines is determined on the basis of a radiation noise frequency on said printed circuit board, and
   a distance between said jumper lines is determined on the basis of the radiation noise frequency in question on said printed circuit board, wherein
   said printed circuit board is a single-sided printed circuit board, and
   said signal lines are arranged between said power-supply lines to extend along a direction of width of said printed circuit board, while said jumper lines are arranged in a direction perpendicular to said power-supply lines.

19. A method of designing a printed circuit board having a plurality of power-supply lines extending parallel to each other, a plurality of signal lines extending parallel to each other, and jumper lines for bridging two arbitrary power-supply lines of said plurality of power-supply lines, comprising:

a step (a) of determining a noise frequency;

a step (b) of determining a cross-sectional area of a loop formed by connecting said two arbitrary power-supply lines through jumper lines on the basis of the determined noise frequency; and a step (c) of determining a distance between said two power-supply lines on the basis of the cross-sectional area of the loop.

20. A printed circuit board having a plurality of power-supply lines extending parallel to each other, and a plurality of signal lines extending parallel to each other, wherein said plurality of power-supply lines are arranged parallel to each other at equal intervals; and jumper lines for bridging and connecting said power-supply lines to each other and said signal lines to each other are formed by using lossy electronic parts.

21. A board according to claim 20, wherein said plurality of electronic parts are arranged at equal intervals in a direction perpendicular to said power-supply lines.

22. A board according to claim 21, wherein each of said electronic parts for bridging and connecting said power-supply lines to each other has a maximum constant within an allowable range based on a power-supply voltage drop.

23. A board according to claim 20, wherein each of said electronic parts for bridging and connecting said signal lines to each other has a maximum constant within a range in which no malfunction occurs due to a blunt signal waveform.

24. A board according to claim 20, wherein said lossy electronic parts are ferrite beads inductors.

25. A board according to claim 20, wherein said lossy electronic parts are resistors.

26. A board according to claim 20, wherein said lossy electronic parts are parts directly formed on said printed circuit board by printing.

\* \* \* \* \*

UNITED STATES PATENT AND TRADEMARK OFFICE
CERTIFICATE OF CORRECTION

PATENT NO. : 6,215,076 B1
DATED : April 10, 2001
INVENTOR(S) : Hideho Inagawa et al.

It is certified that error appears in the above-identified patent and that said Letters Patent is hereby corrected as shown below:

Column 5,
Line 48, "lowers." should read -- decreases. --.

Column 7,
Line 3, "shown" should read -- shown in --.

Column 8,
Line 57, "power-supply" should read -- power-supply lines --.

Column 10,
Line 43, "(Effects" should read -- Effects -- and "Lines)" should read -- Lines --.

Column 16,
Line 23, "Jumper" should read -- jumper --.
Line 39, "Jumper" should read -- jumper --.
Line 48, "noise." should read -- noise, --
Line 50, "½" should read -- 1/20 --.
Line 63, "frequency:" should read -- frequency; --.

Column 18,
Line 16, "½" should read -- 1/20 --.
Line 41, "line" should read -- lines --.
Line 50, "Plurality" should read -- plurality --.

Signed and Sealed this

Thirtieth Day of April, 2002

Attest:

JAMES E. ROGAN
Attesting Officer            Director of the United States Patent and Trademark Office

UNITED STATES PATENT AND TRADEMARK OFFICE
CERTIFICATE OF CORRECTION

PATENT NO. : 6,215,076 B1  
DATED : April 10, 2001  
INVENTOR(S) : Hideho Inagawa et al.

It is certified that error appears in the above-identified patent and that said Letters Patent is hereby corrected as shown below:

Column 4,  
Line 67, "½λ" should read -- (1/20)λ --.

Column 5,  
Lines 8 and 46, "½λ" should read -- (1/20)λ --.

Column 8,  
Line 28, "½λ" should read -- (1/20)λ --.

Signed and Sealed this

Thirtieth Day of July, 2002

*Attest:*

JAMES E. ROGAN  
*Attesting Officer*  *Director of the United States Patent and Trademark Office*